US010141841B1

(12) United States Patent
Ongaro et al.

(10) Patent No.: US 10,141,841 B1
(45) Date of Patent: Nov. 27, 2018

(54) DC-DC CONVERTER WITH A DYNAMICALLY ADAPTING LOAD-LINE

(71) Applicant: Apple Inc., Cupertino, CA (US)

(72) Inventors: Fabio Ongaro, Munich (DE); Michael Couleur, Munich (DE)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/691,472

(22) Filed: Aug. 30, 2017

(51) Int. Cl.
*H02M 3/156* (2006.01)
*H02M 1/14* (2006.01)
*H03F 3/213* (2006.01)
*H02M 1/00* (2006.01)

(52) U.S. Cl.
CPC ........... *H02M 3/156* (2013.01); *H02M 1/14* (2013.01); *H03F 3/213* (2013.01); *H02M 2001/0048* (2013.01); *H03F 2200/129* (2013.01)

(58) Field of Classification Search
CPC .................................. H02M 2003/1566
See application file for complete search history.

(56) References Cited

U.S. PATENT DOCUMENTS

| 9,391,524 B2 | 7/2016 | Oh et al. |
| 9,768,700 B2 | 9/2017 | Oh et al. |
| 9,973,083 B1 | 5/2018 | Rose et al. |
| 2014/0191737 A1* | 7/2014 | Nagasawa ........... H02M 3/1584 323/272 |
| 2015/0097542 A1 | 4/2015 | Repton et al. |

* cited by examiner

*Primary Examiner* — Jeffery S Zweizig
(74) *Attorney, Agent, or Firm* — Meyertons Hood Kivlin Kowert and Goetzel PC; Rory D. Rankin

(57) ABSTRACT

Systems, apparatuses, and methods for efficiently generating a stable output for a transient load for one or more components are described. In various embodiments, a power converter includes two feedback loops to separate the stability and the equivalent output resistance, which allows the bandwidth to increase. The first loop includes a compensator receiving an output current of an amplifier. Additionally, a first converter and a first current mirror generate a target current based on the output current of the amplifier. Based on the target current, multiple step-down converters generate an output voltage, which is returned to the amplifier through a resistor. The second loop includes a second converter with a first order series RC filter to reduce the second loop's response time. A second current mirror receives current from the second converter and generates a dynamically adapting feedback current, which flows through the resistor in the first loop.

20 Claims, 5 Drawing Sheets

DC-DC CONVERTER WITH A DYNAMICALLY ADAPTING LOAD-LINE

BACKGROUND

Technical Field

Embodiments described herein relate to the field of integrated circuits and, more particularly, to efficiently generating a stable output for a transient load for one or more components.

Description of the Related Art

A computing system such as a semiconductor chip includes multiple components, each capable of processing data. The multiple components include interface and functional blocks or units. In various embodiments, the multiple components are individual dies on one of a system on a chip (SOC), a multi-chip module (MCM) or a printed circuit board. Examples of components are general-purpose processors with one or more cores in a central processing unit (CPU), highly parallel data architected processors with one or more cores in graphics processing units (GPUs) and digital signal processors (DSPs), display controllers, audio processing components, networking components, peripheral interface controllers, memory controllers, and so on.

Control logic, such as a power management unit, within the computing system determines one or more operating states for the different components. The operating state includes a power supply voltage and an operational clock frequency. Clock generating circuitry generates different clock signals at the one or more specified different frequencies, whereas a power distribution network provides the one or more specified different power supply voltages. This on-chip network uses power supplies and regulation circuits to generate the specified different power supply voltages for use by the devices within the functional units. Additionally, the network relies on a pair of on-chip planes where one voltage plane (metal layer) is dedicated to the power supply voltage and another ground plane (metal layer) is dedicated to the ground value.

The target output voltage changes as the operating modes change over time and the work demand at a given operating mode changes over time for the one or more components. When devices in the components draw current from the power and ground planes, the changes in the demand of current creates both a current-resistance (IR) drop and a transient voltage drop. Although the duration of the voltage variation may be temporary, the voltage variation causes unreliable behavior for the devices causing the variation and neighboring devices. Additionally, for mobile devices, a voltage value provided by a battery reduces as the stored energy is consumed.

In view of the above, methods and mechanisms for efficiently generating a stable output for a transient load for one or more components are desired.

SUMMARY

Systems and methods for management of operating modes for efficiently generating a stable output for a transient load for one or more components are contemplated. In various embodiments, a power converter receives an input voltage and generates an output voltage on an output capacitor for one or more components. In some embodiments, the multiple components are individual dies on one of a system on a chip (SOC). The power converter includes an amplifier for conveying an output current based on a differential voltage input. In various embodiments, the power converter includes two feedback loops ending on one of the two inputs of the amplifier. The two feedback loops separate the stability and the equivalent output resistance of the power converter, which allows the bandwidth of the power converter to increase. A first loop of the two feedback loops provides the equivalent output resistance of the power converter. A second loop of the two feedback loops provides stability for the power converter. By separating the equivalent output resistance and stability, each become independent parameters for the power converter.

In an embodiment, the power converter includes an operational transconductance amplifier (OTA) and a first feedback loop that includes a compensator. In various embodiments, the compensator may be one of two types. In an embodiment, the compensator may be of a first type providing an origin pole, one zero, one high-frequency pole, and a phase boost reaching 90 degrees to counteract some of the gains and phases contained in the transfer function. For example, the first type of compensator may be a Type II compensator, which provides two poles and one zero as well as the locations of the two poles and the one zero and additionally the phase boost reaching 90 degrees. Alternatively, the compensator may be of a second type providing two poles, two zeroes and a phase boost greater than 90 degrees. For example, the second type of compensator may be a Type III compensator.

The compensator generates a voltage based on the output current of the OTA. The first feedback loop also includes a transistor with a gate terminal receiving the generated voltage. Since the transistor receives a current on the drain terminal based on the generated voltage, the transistor is a converter, which converts the generated voltage to the current. The current is a reference current for a first current mirror. The current source transistor of the first current mirror sends a target current proportional to the reference current to one or more step-down direct current to direct current (DC-DC) converters. In some embodiments, each step-down DC-DC converter is a current mode buck converter. In an embodiment, two or more step-down DC-DC converters are connected in parallel to provide a multiphase step-down DC-DC converter. The switching frequency of the individual step-down DC-DC converters is phase shifted with respect to one another, which results in cancellation of the ripple currents flowing in input and output filters. The one or more step-down DC-DC converters generate respective inductor currents used to charge a single output capacitance, which generates an output voltage based on the received target current.

The output voltage is returned to an input of the OTA through a resistor. The resistor also receives a dynamically adapting feedback current supplied by a second feedback loop. The dynamically adapting feedback current creates a voltage drop across the resistor between the input of the amplifier and the output voltage. Therefore, the feedback voltage received on one input of the OTA is greater than the output voltage. The feedback voltage is compared to a reference voltage by the OTA.

The second feedback loop receives the voltage generated by the compensator (first type or second type, e.g., a Type II or III as mentioned above) in the first feedback loop. Another transistor receives the generated voltage on a gate terminal through a first order series resistor-capacitor (RC) filter. The RC filter causes a response time of the second loop to be greater than a response time of the first loop. Since the transistor receives a current on the drain terminal based on the generated voltage, the transistor is also a converter, which converts the generated voltage to the current passing through the drain terminal. The current is a reference current for a second current mirror. The second current mirror has multiple current source transistors, each connected to a switch. One or more of the multiple current source transistors connected to closed switches generate the dynamically adapting feedback current based on the reference current of the second current mirror.

Control logic in the second feedback loop opens and closes switches for the multiple current source transistors in a manner to increase the dynamically adapting feedback current in response to determining a difference between the output voltage and a target voltage is increasing. The control logic adjusts the opening and closing of the switches in a manner to decrease the dynamically adapting feedback current in response to determining a difference between the output voltage and a target voltage is decreasing.

These and other embodiments will be further appreciated upon reference to the following description and drawings.

BRIEF DESCRIPTION OF THE DRAWINGS

The above and further advantages of the methods and mechanisms may be better understood by referring to the following description in conjunction with the accompanying drawings, in which.

Figure 1:
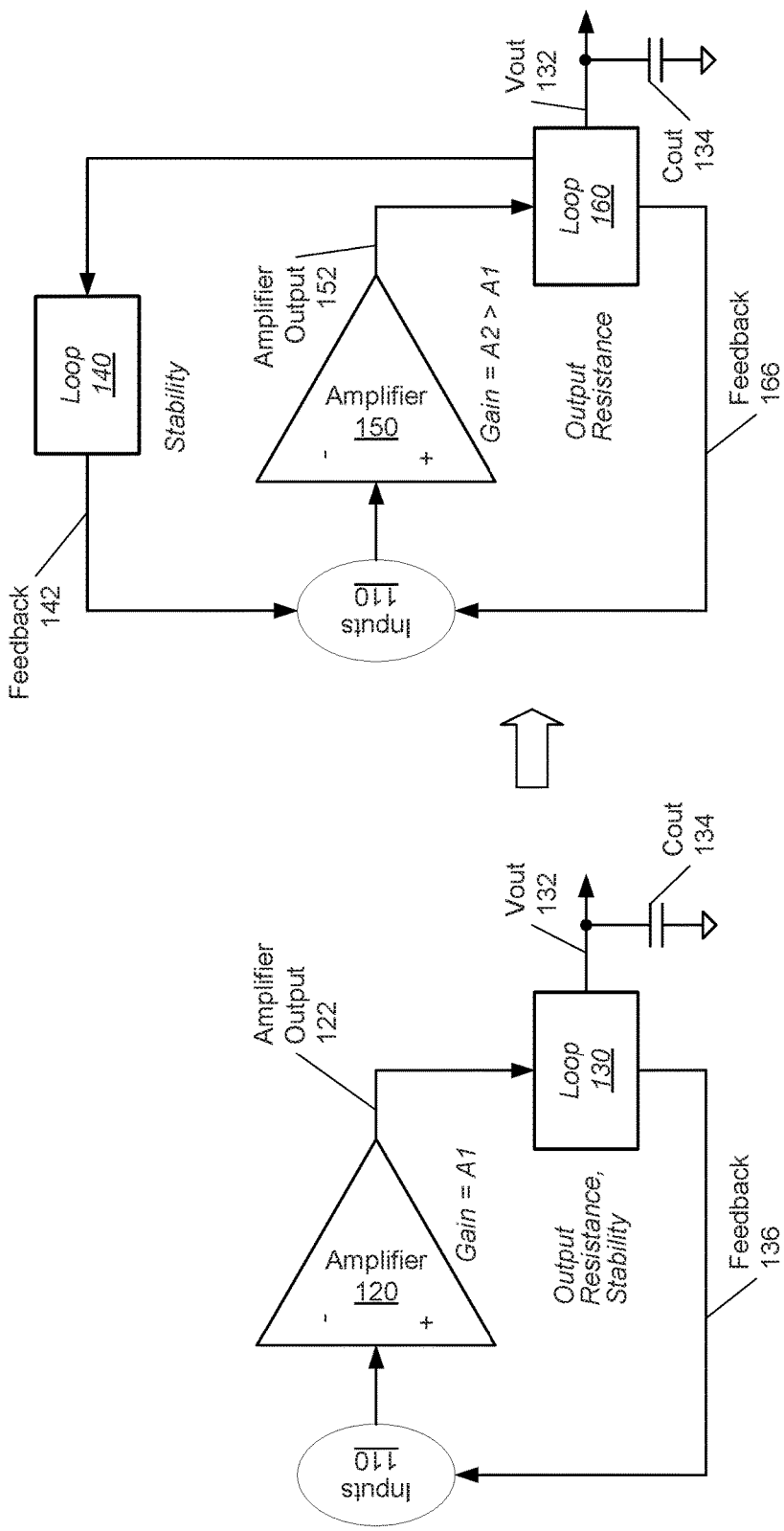
FIG. 1 is a block diagram of one embodiment of amplifiers with feedback loops.

While the embodiments described in this disclosure may be susceptible to various modifications and alternative forms, specific embodiments thereof are shown by way of example in the drawings and will herein be described in detail. It should be understood, however, that the drawings and detailed description thereto are not intended to limit the embodiments to the particular form disclosed, but on the contrary, the intention is to cover all modifications, equivalents and alternatives falling within the spirit and scope of the appended claims. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112(f) for that unit/circuit/component.

DETAILED DESCRIPTION OF EMBODIMENTS

In the following description, numerous specific details are set forth to provide a thorough understanding of the embodiments described in this disclosure. However, one having ordinary skill in the art should recognize that the embodiments might be practiced without these specific details. In some instances, well-known circuits, structures, and techniques have not been shown in detail for ease of illustration and to avoid obscuring the description of the embodiments.

Turning now to FIG. 1, a generalized block diagram of one embodiment of amplifiers with feedback loops is shown. In the illustrated embodiment, amplifier 120 receives one or more inputs 110 and generates an amplifier output 122. The loop 130 receives the amplifier output 122 and generates the voltage output Vout 132, which charges the output capacitor Cout 134. In addition, loop 130 sends feedback information 136 to the inputs 110. Each of the gain A1 of the amplifier 120 and the loop 130 affect the equivalent output resistance of the circuit in addition to the stability.

The bandwidth (BW) of the circuit on the left is given by the below expression:

$$BW=1/(2\pi \times Rout \times Cout)$$

The output capacitance Cout 134 is relatively fixed and dependent upon the one or more components connected to the output node. In an embodiment, a relatively high bandwidth is desired to generate a stable output for a transient output load. For example, the circuit is designed to maintain a stable Vout 132 on the output Cout although the amount of current drawn by the load changes. However, the bandwidth is limited by the switching frequency of the circuit and the Nyquist frequency of the circuit. Therefore, as seen in the above expression, the equivalent output resistance Rout is also limited, which limits the circuit's ability to maintain a stable Vout 132 on the output Cout in the presence of transient current draw on the output.

In an embodiment, the amplifier 120 is an operational transconductance amplifier (OTA) with a gain (gm) equal to A1. The gain is relatively small to increase stability, which also limits the accuracy of maintaining a stable Vout 132 in the presence of transient current draw on the output. In one embodiment, the circuit on the left is a multiphase power converter. In some embodiments, the loop 130 includes a current mirror for translating the output current of the OTA to a target current. One or more step-down direct current to direct current (DC-DC) converters receive the target current and an input voltage. The one or more step-down DC-DC converters generate the output voltage Vout 132.

In some embodiments, each of the one or more step-down DC-DC converters is a current mode step-down converter. In an embodiment, each step-down DC-DC converter is a buck converter. In one embodiment, two or more step-down DC-DC converters are connected in parallel to provide a multiphase step-down DC-DC converter. The switching frequency of the individual step-down DC-DC converters is phase shifted with respect to one another, which results in cancellation of the ripple currents flowing in input and output filters. The loop 130 also returns either Vout 132 or a voltage value based on Vout 132 as feedback information 136 to the inputs 110. In an embodiment, the inputs 110 include a reference voltage and a feedback voltage from loop 130. The OTA 120 generates the output current based on the differential voltage input.

The loop 130 and feedback information 136 provides versatility in addition to functionality, but also reduces stability. When the gain A1 of amplifier 120 increases, the upper threshold of the inputs 110 reduces, and when reached, the amplifier output 122 may saturate, which reduces the stability of the circuit. Stability typically is referred to the output Vout 132 reaches a non-oscillatory state. However, undesirable characteristics, such as poor phase response, overshoot, and ringing, occur prior to oscillation occurs. Designers determine thresholds for one or more of these characteristics when defining stability for the circuit. Regardless, the ability to maintain Vout 132 as a relatively stable output value despite changing current loads is more easily achieved when the equivalent output resistance is able to change without affecting stability.

When the circuit is used as a power converter, the equivalent output resistance is also referred to as a load-line. In some cases, no load-line is desired such as for power rails where the target output voltage is fixed and it is desired to maintain Vout 132 at the target voltage independent of changing current draw by external components. Such a condition reduces Rout to 0 in the above expression and changes BW to an infinite value. An attempt to achieve the added flexibility is shown in the circuit on the right. As shown, amplifier 120 is replaced with amplifier 150, which has a gain A2 greater than the gain A1. In addition, loop 130 is replaced with loop 160, and a second loop, which is shown as loop 140, is added.

In some embodiments, loop 160 includes components to prevent saturation of the amplifier output 152 and Vout 132. A further description of these components is provided shortly. Loop 160 sends feedback information 166 to the inputs 110. Loop 140 sends feedback information 142 to the inputs 110. In various embodiments, loop 140 includes components to create a response time of the second loop that is greater than a response time of the first loop. In an embodiment, loop 160 defines the load-line of the circuit while loop 140 maintains stability of the circuit.

Figure 2:
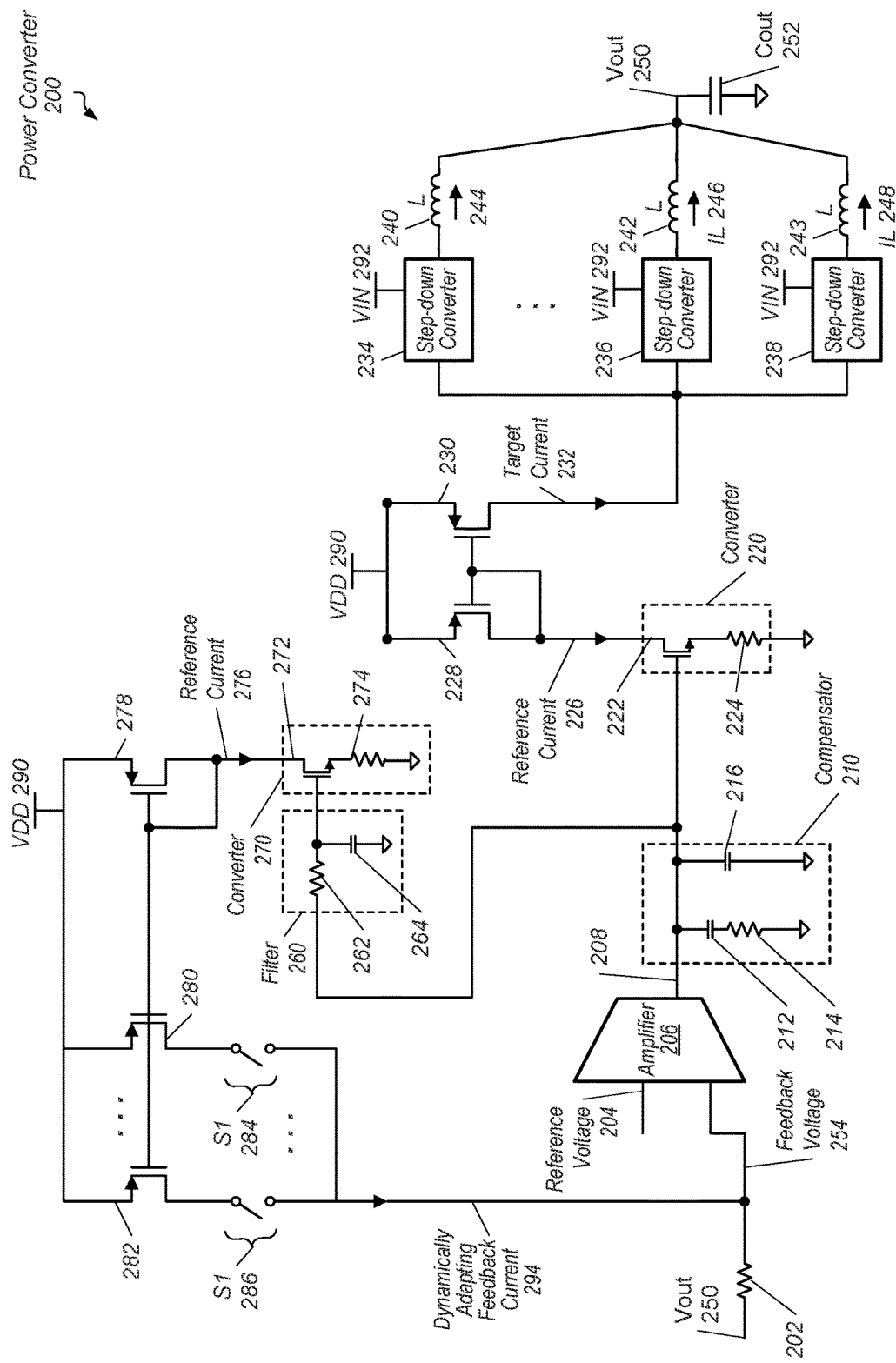
FIG. 2 is a block diagram of one embodiment of a power converter.

Turning now to FIG. 2, a generalized block diagram of one embodiment of a power converter 200 is shown. In various embodiments, power converter 200 receives an input voltage 292 and generates an output voltage Vout 250 on output capacitor 252. Power converter 200 includes an amplifier 206 for conveying an output current on node 208 based on a differential voltage input. As shown, the inputs are a reference voltage 204 and a feedback voltage 254 based on the output voltage Vout 250. In an embodiment, amplifier 206 is an error amplifier, which compares the reference voltage 204 and the feedback voltage 254. The amplifier 206 amplifies the difference on the inputs and generates an output current based on the amplified difference. Therefore, in various embodiments, amplifier 206 is an operational transconductance amplifier (OTA). An OTA is an open-loop amplifier with no local feedback to provide stability. Therefore, feedback is provided externally to provide stability. In various embodiments, power converter 200 includes two feedback loops for generating the feedback voltage 254. The two feedback loops separate the stability and the equivalent output resistance of power converter 200, which allows the bandwidth of power converter 200 to increase. A first loop of the two feedback loops provides the equivalent output resistance of the power converter 200. A second loop of the two feedback loops provides stability for the power converter 200. Therefore, the equivalent output resistance and the stability are independent parameters for the power converter when the second loop is added.

In various embodiments, compensation is added to an error amplifier, such as amplifier 206, to counteract phases included in the closed-loop control-to-output transfer function, which could reduce stability. Therefore, as used herein, a compensator refers to circuitry configured to provide a phase boost by adding one or more poles and zeroes in the closed-loop transfer function. In an embodiment, the compensator may be of a first type providing an origin pole, one zero and one high-frequency pole as well as the locations of the two poles and additionally a phase boost reaching 90 degrees. For example, the first type of compensator may be a Type II compensator. The Type II compensator includes a series combination of a capacitor and a resistor between the output of the OTA and a ground reference. Additionally, the Type II compensator includes a capacitor in parallel with the series combination.

Alternatively, the compensator may be of a second type providing two poles, two zeroes and a phase boost between 90 degrees and 180 degrees. For example, the second type of compensator may be a Type III compensator. The Type III compensator includes a first series combination of a capacitor and a resistor between the output of the OTA and an input of the OTA. Additionally, the Type III compensator includes a capacitor in parallel with the first series combination. Further, the Type III compensator includes a second series combination of a resistor and a capacitor between the power supply and the input of the OTA as well as a resistor in parallel with the second series combination.

In some embodiments, compensator 210 generates a voltage based on the output current of amplifier 206. As shown, compensator 210 is a Type II compensator for amplifier 206. As shown, compensator 210 includes a capacitor 212 in series with a resistor 214. In addition, compensator 210 includes a second capacitor 216 in parallel with the series combination of capacitor 212 and resistor 214. In other embodiments, compensator 210 is a Type III compensator for amplifier 206.

Converter 220 is a voltage-to-current (V-to-I) converter, which receives the voltage generated by compensator 210 and generates the reference current 226 based on the received voltage. As shown, converter 220 includes transistor 222 and resistor 224. As shown, transistor 222 is an n-type field effect transistor (nfet), which receives the generated voltage on its gate terminal. In addition, reference current 226 flows through its drain terminal. In an embodiment, reference current 226 is proportional to the voltage on the gate terminal of transistor 222 divided by the resistance of resistor 224. Reference current 226 is the reference current for the current mirror formed by transistors 228 and 230. Each of transistors 228 and 230 is a p-type field effect transistor (pfet). Transistor 228 is a diode-connected transistor for the current mirror, which receives the reference current 226. The source terminals of transistors 228 and 230 are connected to the supply voltage VDD 290.

Transistor 230 is a current source transistor for the current mirror. When the device widths of the diode-connected transistor 238 of the current mirror and the current source transistor 230 of the current mirror match, the target current 232 equals the reference current 226. With a non-unity ratio between the device widths, the target current 232 is a scaled version of the reference current 226 based on the non-unity ratio. A scaled version of a given current in a current mirror is a current with smaller or larger amperage compared to the given current. In one embodiment, it is larger (e.g. twice, etc.). In another embodiment, it is smaller (e.g., half, etc.).

In an embodiment, the scaled version of the given current is a current that is equal to the given current multiplied by the device width of the current source transistor of the current mirror divided by the device width of the diode-connected transistor of the current mirror. For example, if the device width of the current source transistor 230 is twice the device width of the diode-connected transistor 228, then the target current 232 is twice the amperage of the reference current 226.

Multiple step-down direct current to direct current (DC-DC) converters 234-238 receive the target current 232 and generate the output voltage Vout 250 based on the target current 232 and the input voltage VIN 292. In some embodiments, the input voltage VIN 292 is sent from an alternating current (AC) to direct current (DC) power supply, and Vout 250 is a fraction of VIN 292 based on the duty cycle within the step-down DC-DC converters 234-238. Each of the step-down converters 234-238 generates a respective one of the inductor currents 244-248 which flows through a respective one of the inductors 240-243. The sum of the inductor currents 244-248 charges the output capacitor Cout 252 to Vout 250.

The effective switching frequency is multiplied by the number of phases while the load is divided by the number of phases. Increasing the number of step-down converters 234-238 reduces ripple current in input and output filters, such as LC low pass filters, which improves the transient response, but it also increases design complexity and layout difficulty. In various embodiments, each of the step-down converters 234-238 is a current mode step-down converter. In some embodiments, each step-down converter is a buck converter and power converter 200 is a multiphase buck converter. In some embodiments, the multiple step-down DC-DC converters 234-238 are connected in parallel as shown to provide a multiphase step-down DC-DC converter. The switching frequency of each individual one of the step-down DC-DC converters 234-238 is phase shifted with respect to one another, which results in cancellation of the ripple currents flowing in input and output filters.

The output voltage Vout 250 is returned to an input of amplifier 206 through resistor 202. The resistor 202 also receives a dynamically adapting feedback current 294 supplied by another current mirror. The dynamically adapting feedback current 294 creates a voltage drop across resistor 202. Therefore, the feedback voltage 254 is greater than Vout 250. The feedback voltage 254 is compared to the reference voltage 204 by amplifier 206.

Similar to converter 220, converter 270 receives a voltage based on the voltage generated by compensator 210. However, converter 270 receives the generated voltage through a first order series resistor-capacitor (RC) filter 260. RC filter 260 includes resistor 262 and capacitor 264. RC filter 260 creates a response time of the second loop to be greater than a response time of the first loop. The second loop begins with the voltage generated by compensator 210 and includes RC filter 260, converter 270, and the current mirror generating the dynamically adapting feedback current 294. The first loop begins with converter 220 and includes the current mirror generating the target current 232, the multiple step-down converters 234-238 and resistor 202. The first loop provides the load-line, or the equivalent output resistance of converter 200. The second loop provides stability for converter 200. Therefore, the load-line and stability are independent parameters for converter 200.

Converter 270 is a voltage-to-current (V-to-I) converter, which receives the voltage generated by compensator 210 after it passes through RC filter 260. As shown, converter 270 includes transistor 272 and resistor 274. Transistor 272 is an nfet, which receives the output of RC filter 260 on its gate terminal and reference current 276 flows through its drain terminal. Reference current 276 is the reference current for the current mirror formed by transistors 278-282. Each of transistors 278-282 is a pfet. The source terminals of transistors 278-282 are connected to the supply voltage VDD 290.

Transistor 278 is a diode-connected transistor for the current mirror. This current mirror has multiple current source transistors 280-282, each connected to a switch. For example, transistor 280 is connected to switch S1 284. Transistor 282 is connected to switch S2 286. The current mirror may include any number of current source transistors and switches. When one or more of the multiple current source transistors 280-282 are connected to a corresponding closed switch, these current source transistors generate the dynamically adapting feedback current 294 based on the reference current 276.

Similar to the current mirror generating the target current 232, when the device width of the diode-connected transistor 278 matches the sum of the device widths of the one or more current source transistors 280-282 connected to a closed switch, the dynamically adapting feedback current 294 equals the reference current 276. With a non-unity ratio between the device width of the diode-connected transistor 278 and the sum of the device widths of the one or more current source transistors 280-282 connected to a closed switch, the dynamically adapting feedback current 294 is a scaled version of the reference current 276 based on the non-unity ratio.

Control logic (not shown) opens and closes switches 284-286 in a manner to increase the dynamically adapting feedback current 294 in response to determining a difference between Vout 250 and a target voltage is increasing. Power converter 200 is relied upon to maintain the target voltage, but when the current drawn by one or more components receiving Vout 250 changes, the output voltage Vout 250 may change. The first loop regulates Vout 250 and returns it to the target voltage. The second loop maintains stability by preventing oscillation of Vout 250 due to the relatively high gain of amplifier 206. The control logic adjusts the opening and closing of the switches 284-286 in a manner to decrease the dynamically adapting feedback current 294 in response to determining a difference between the output voltage and a target voltage is decreasing.

Figure 3:
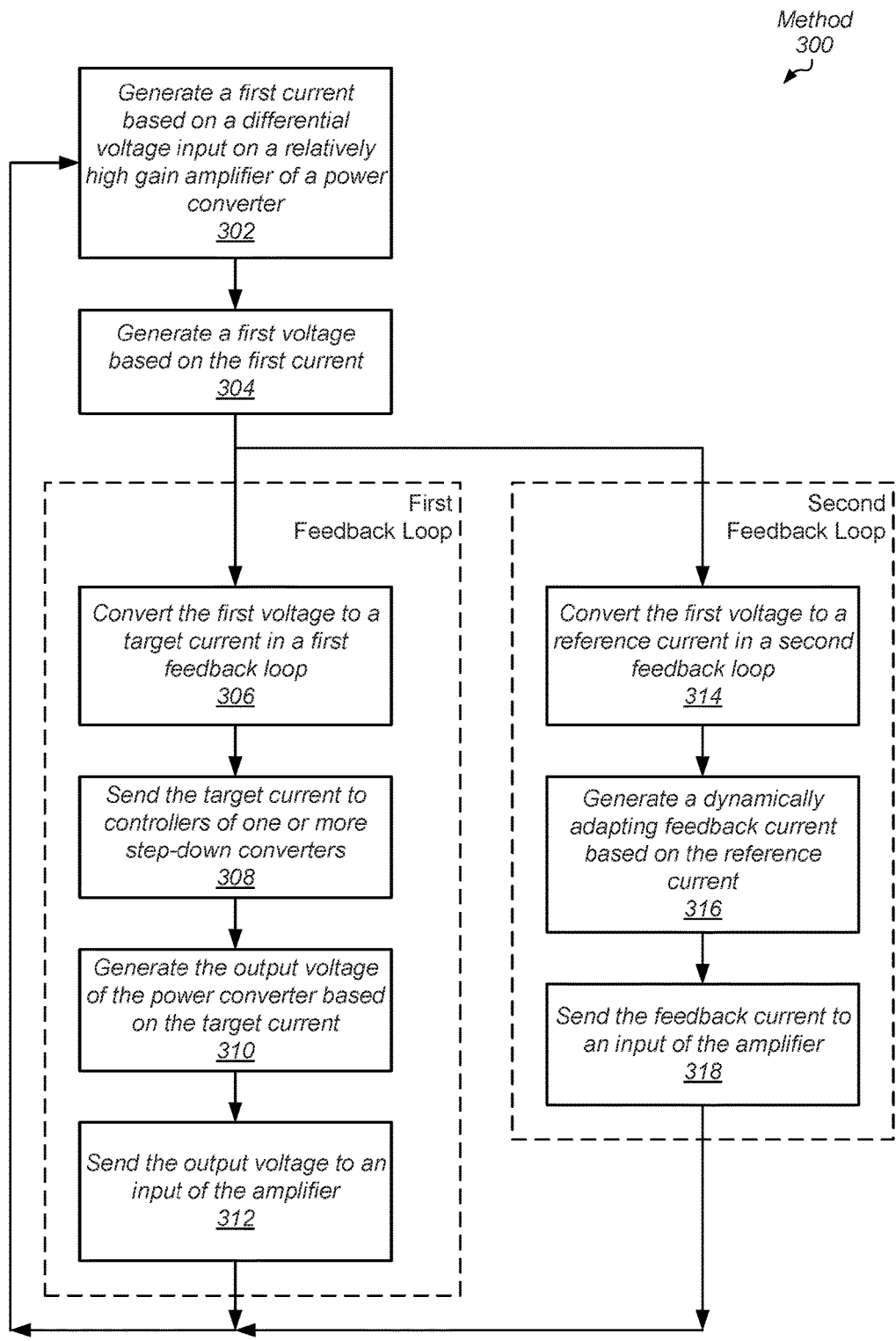
FIG. 3 is a flow diagram of one embodiment of a method for efficiently generating a stable output for a transient load for one or more components.

Referring now to FIG. 3, a generalized flow diagram of one embodiment of a method 300 for efficiently generating a stable output for a transient load for one or more components is shown. For purposes of discussion, the steps in this embodiment are shown in sequential order. However, in other embodiments some steps may occur in a different order than shown, some steps may be performed concurrently, some steps may be combined with other steps, and some steps may be absent.

A first current is generated based on a differential voltage input on a relatively high gain amplifier of a power converter (block 302). A first voltage is generated based on the first current (block 304). For example, an OTA generates the first current as an output current and a compensator generates the first voltage based on the first current. In some embodiments, the compensator is a Type II compensator for the OTA. The first voltage is converted to a target current in a first feedback loop (block 306). For example, the first loop includes a voltage-to-current converter followed by a current mirror.

The target current is sent to controllers of one or more step-down DC-DC converters (block 308). The one or more step-down DC-DC converters generate the output voltage of the power converter based on at least the target current (block 310). The output voltage is sent to an input of the amplifier (block 312). In some embodiments, a series resistor is used to increase the feedback voltage, which is input to the amplifier, above the output voltage.

In some embodiments, block 314 occurs simultaneously with block 306 as the second feedback loop begins at a similar time as the first feedback loop. The first voltage, which is output by the compensator is converted to a reference current (block 314). For example, the first loop includes a voltage-to-current converter followed by a current mirror. However, the voltage-to-current converter includes a first order series RC filter, which creates the response time of the second loop to be greater than the response time of the first loop. Therefore, the first loop may quickly begin regulating the output voltage of the power converter, and a short time later, the second loop ensures oscillation does not occur and stability is maintained.

The current mirror in the second loop includes multiple current source transistors, each connected to a switch. The device widths and the control of the switches are used to generate and adjust a dynamically adapting feedback current based on the reference current in the second loop (block 316). In some embodiments, the dynamically adapting feedback current flows through the series resistor in the first loop, which adjusts the feedback voltage appearing on the input of the amplifier (block 318).

Figure 4:
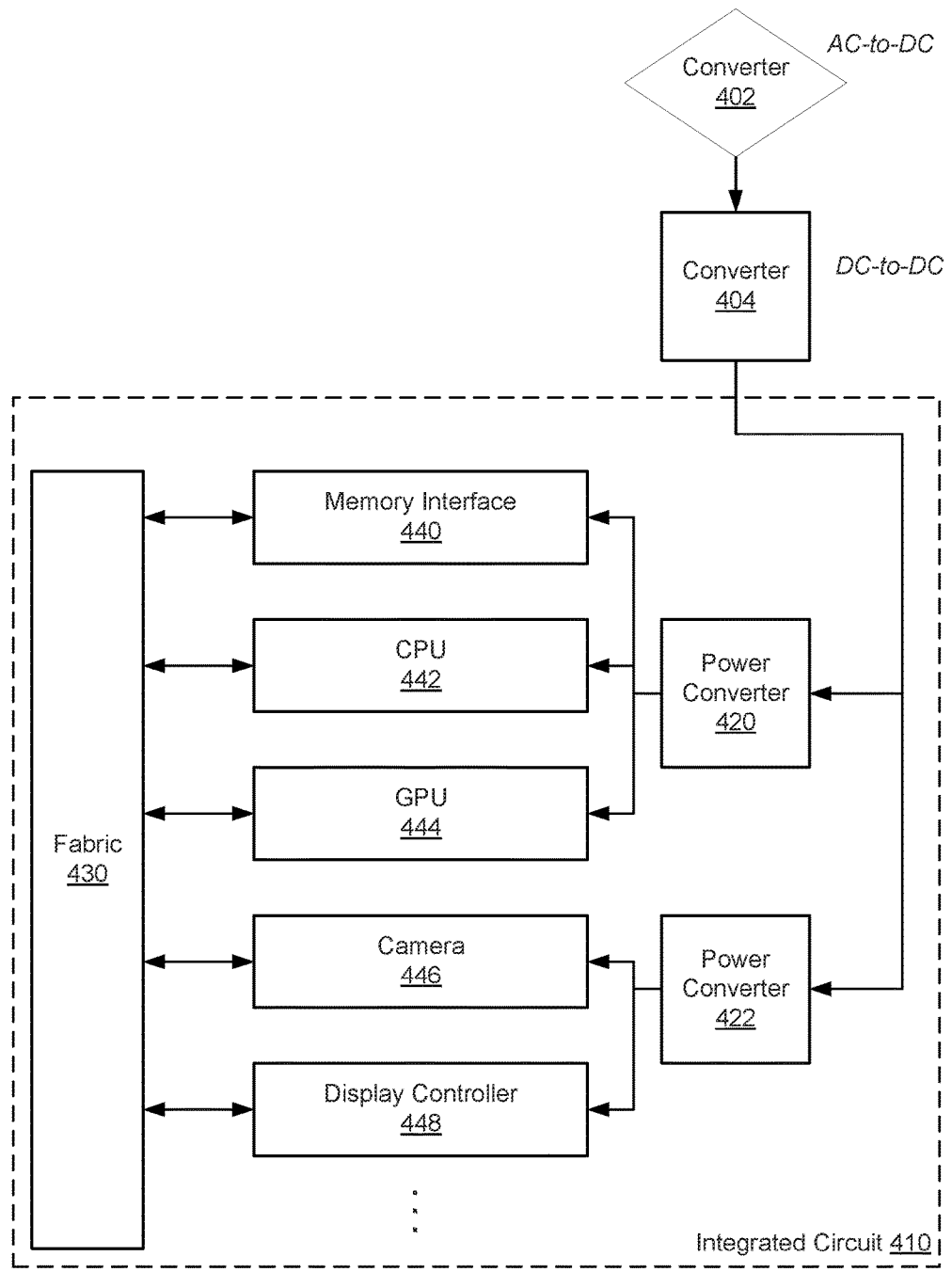
FIG. 4 is a block diagram of one embodiment of an integrated circuit.

Referring now to FIG. 4, a generalized block diagram of one embodiment of an integrated circuit (IC) 400 is shown. As shown, an alternating current (AC) to direct current (DC) converter 402 converts an AC voltage to a DC voltage and sends the DC voltage to converter 404, which is a DC to DC converter. Converter 404 sends a DC voltage to IC 410. In various embodiments, IC 410 receives a 12V bus. Each of the power converters 420 and 422 receive the output of converter 404 and generates a corresponding output voltage for one or more components on IC 410. In some embodiments, a power management unit (not shown) provides control signals to power converters 420 and 422 for adjusting the operating voltage for components on IC 410.

In the illustrated embodiment, IC 410 includes a fabric 430 for high-level interconnects and chip communication, a memory interface 440, a general-purpose central processing unit (CPU), a processor with a parallel data microarchitecture such as a graphics processing unit (GPU), a camera 446 and a display controller 448. Various input/output (I/O) interfaces, clock sources, such as phase lock loops (PLLs), and other functional units are not shown for ease of illustration. As shown, power converter 420 sends an operating voltage to the memory controller 440, the CPU 442 and the GPU 444. Power converter 422 sends an operating voltage to the camera 446 and the display controller 448. Another number of power converters and other combinations of connections are possible and contemplated. In various embodiments, each of power converters 420 and 422 is a multiphase, current mode buck converter with two feedback loops as described earlier for power converter 200 in FIG. 2.

In various embodiments, the fabric 430 provides a top-level interconnect for IC 410. Fabric 430 may maintain cache coherence for memory requests and route requests between components on IC 410. An example of a cache coherency protocol includes the MOESI protocol with the Modified (M), Owned (O), Exclusive (E), Shared (S), and Invalid (I) states. Fabric 430 may include one or more switch bars to aggregate traffic. In various embodiments, different types of traffic flow independently through the fabric 430. The independent flow is accomplished by allowing a single physical fabric bus to include a number of overlaying virtual channels, or dedicated source and destination buffers, each carrying a different type of traffic. Each channel is independently flow controlled with no dependence between transactions in different channels.

The memory interface 440 may include a memory controller and a cache to reduce the demands on memory bandwidth and average power consumption. In an embodiment, the allocation policy for the cache is programmable. The interface between the combination of the memory interface 440 and the remainder of IC 410 may include multiple buses. Asynchronous memory requests, responses, snoops, snoop responses, and input/output (I/O) transactions are visible at this interface with temporal relationships.

The CPU 442 uses circuitry for executing instructions according to a predefined general-purpose instruction set. Any of a variety of instruction set architectures (ISAs) may be chosen. The CPU 442 may one or more cores and one or more levels of a cache memory subsystem. Each core supports the out-of-order execution of one or more threads of a software process and include a multi-stage pipeline. The GPU 444 has a micro-architecture which provides high instruction throughput for a computational intensive task such as a single instruction multiple data (SIMD) core.

The camera 446 uses an image blender capability and other camera image processing capabilities as is well known in the art. One or more other processing blocks associated with real-time memory performance for display may be added along with the camera 446 such as a video graphics controller. The display controller 448 sends graphics output information that was rendered to one or more display devices. The rendering of the information is performed by the display controller 448. Frame buffers stored in an off-die DRAM or an on-die cache 914 includes at least color values for each pixel on the screen.

Figure 5:
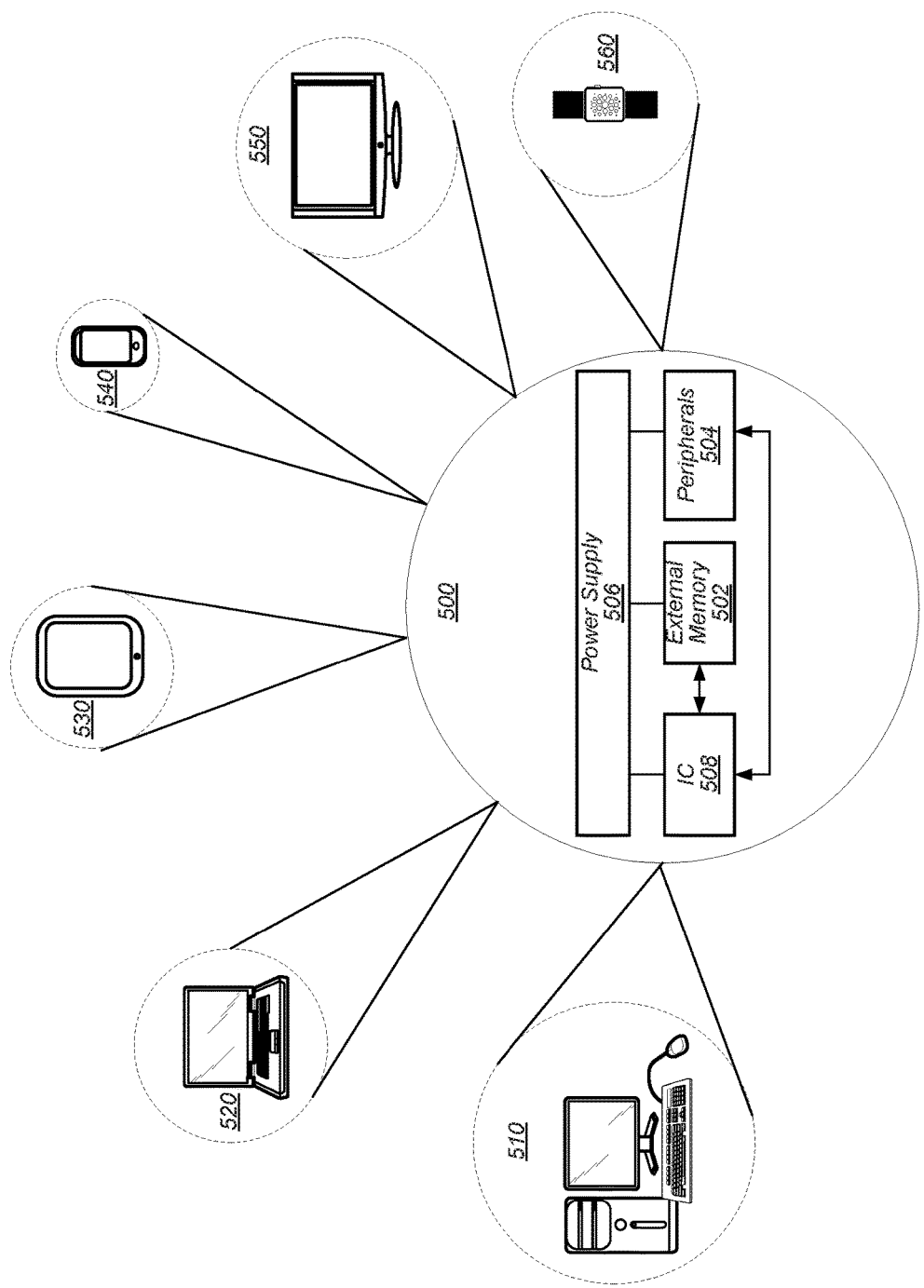
FIG. 5 is a block diagram of one embodiment of a system.

Turning next to FIG. 5, a block diagram of one embodiment of a system 500 is shown. As shown, system 500 may represent chip, circuitry, components, etc., of a desktop computer 510, laptop computer 520, tablet computer 530, cell or mobile phone 540, television 550 (or set top box configured to be coupled to a television), wrist watch or other wearable item 560, or otherwise. Other devices are possible and are contemplated. In the illustrated embodiment, the system 500 includes at least one instance of IC 508 which may include the functionality of IC 410 (of FIG. 4) with one or more power converters. The power converters may include two feedback loops as described for power converter 200 (of FIG. 2). IC 508 may be coupled to external memory 502, peripherals 504, and power supply 506.

IC 508 is coupled to one or more peripherals 504 and the external memory 502. A power supply 506 is also provided which supplies the supply voltages to IC 508 as well as one or more supply voltages to the memory 502 and/or the peripherals 504. In various embodiments, power supply 506 may represent a battery (e.g., a rechargeable battery in a smart phone, laptop or tablet computer). In some embodiments, more than one instance of IC 508 may be included (and more than one external memory 502 may be included as well).

The memory 502 may be any type of memory, such as dynamic random access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR2, etc.), RAMBUS DRAM (RDRAM), static RAM (SRAM), etc. One or more memory devices may be coupled onto a circuit board to form memory modules such as single inline memory modules (SIMMs), dual inline memory modules (DIMMs), etc. Alternatively, the devices may be mounted with an SoC or IC containing processor 100 in a chip-on-chip configuration, a package-on-package configuration, or a multi-chip module configuration.

The peripherals 504 may include any desired circuitry, depending on the type of system 500. For example, in one embodiment, peripherals 504 may include devices for various types of wireless communication, such as Wi-Fi, Bluetooth, cellular, global positioning system, etc. The peripherals 504 may also include additional storage, including RAM storage, solid state storage, or disk storage. The peripherals 504 may include user interface devices such as a display screen, including touch display screens or multi-touch display screens, keyboard or other input devices, microphones, speakers, etc.

In various embodiments, program instructions of a software application may be used to implement the methods and/or mechanisms previously described. The program instructions may describe the behavior of hardware in a high-level programming language, such as C. Alternatively, a hardware design language (HDL) may be used, such as Verilog. The program instructions may be stored on a non-transitory computer readable storage medium. Numerous types of storage media are available. The storage medium may be accessible by a computer during use to provide the program instructions and accompanying data to the computer for program execution. In some embodiments, a synthesis tool reads the program instructions in order to produce a netlist comprising a list of gates from a synthesis library.

It should be emphasized that the above-described embodiments are only non-limiting examples of implementations. Numerous variations and modifications will become apparent to those skilled in the art once the above disclosure is fully appreciated. It is intended that the following claims be interpreted to embrace all such variations and modifications.

What is claimed is:

1. A power converter comprising:
   an amplifier configured to convey an output current;
   a first loop comprising:
      a compensator configured to generate a first voltage based on the output current;
      first circuitry configured to:
         generate an output voltage based on the first voltage; and
         convey the output voltage to an input of the amplifier; and
      a second loop comprising second circuitry configured to:
         generate a dynamically adapting feedback current based on the first voltage; and
         convey the dynamically adapting feedback current to the input of the amplifier.

2. The power converter as recited in claim 1, wherein the amplifier is an operational transconductance amplifier (OTA) and the compensator is a Type II compensator for the OTA.

3. The power converter as recited in claim 1, wherein the first circuitry comprises:
   a first current mirror configured to generate each of a first reference current and a target current based on the first reference current; and
   a plurality of step-down converters configured to:
      receive the target current; and
      generate the output voltage on an output node based at least in part on the target current.

4. The power converter as recited in claim 3, wherein the first circuitry further comprises a resistor connected to the output node and the input of the amplifier, wherein the dynamically adapting feedback current creates a voltage drop across the resistor between the input of the amplifier and the output voltage.

5. The power converter as recited in claim 1, wherein the second circuitry comprises:
   a second current mirror comprising:
      a diode-connected transistor configured to generate a second reference current;
      a plurality of current source transistors, each connected to a switch, wherein one or more of the plurality of current source transistors connected to closed switches generate the dynamically adapting feedback current based on the second reference current.

6. The power converter as recited in claim 5, wherein the second circuitry comprises a second converter comprising:
   a first order series resistor-capacitor (RC) filter configured to receive the first voltage, wherein the RC filter creates a response time of the second loop that is greater than a response time of the first loop; and
   a transistor with a drain terminal connected to the diode-connected transistor and a gate terminal connected to an output of the RC filter.

7. The power converter as recited in claim 5, wherein the second circuitry further comprises control logic configured to open and close the switches for one or more of the plurality of current source transistors to increase the dynamically adapting feedback current in response to determining a difference between the output voltage and a target voltage is increasing.

8. The power converter as recited in claim 7, wherein the control logic is further configured to open and close the switches for one or more of the plurality of current source transistors to decrease the dynamically adapting feedback current in response to detecting a difference between the output voltage and a target voltage is decreasing.

9. A method comprising:
   conveying an output current from an amplifier;
   generating, by a compensator, a first voltage based on the output current;
   first circuitry for:
      generating an output voltage based on the first voltage; and
      conveying the output voltage to an input of the amplifier; and
   second circuitry for:
      generating a dynamically adapting feedback current based on the first voltage; and
      conveying the dynamically adapting feedback current to the input of the amplifier.

10. The method as recited in claim 9, wherein the amplifier is an operational transconductance amplifier (OTA) and the compensator is a Type II compensator for the OTA.

11. The method as recited in claim 9, wherein the first circuitry comprises:
   a first current mirror for generating each of a first reference current and a target current based on the first reference current; and a plurality of step-down converters for:
  receiving the target current; and
  generating the output voltage on an output node based at least in part on the target current.

12. The method as recited in claim 11, wherein the first circuitry further comprises a resistor connected to the output node and the input of the amplifier, wherein the dynamically adapting feedback current creates a voltage drop across the resistor between the input of the amplifier and the output voltage.

13. The method as recited in claim 9, wherein the second circuitry comprises:
  a second current mirror comprising:
    a diode-connected transistor for generating a second reference current;
    a plurality of current source transistors, each connected to a switch, wherein one or more of the plurality of current source transistors connected to closed switches generate the dynamically adapting feedback current based on the second reference current.

14. The method as recited in claim 13, wherein the second circuitry comprises a second converter comprising:
  a first order series resistor-capacitor (RC) filter for receiving the first voltage, wherein the RC filter creates a response time of the second loop that is greater than a response time of the first loop; and
  a transistor with a drain terminal connected to the diode-connected transistor and a gate terminal connected to an output of the RC filter.

15. A system on a chip comprising:
  a primary converter configured to convert an external voltage to an internal voltage;
  a plurality of functional units; and
  a power converter configured to generate an output voltage based on at least the internal voltage to one or more of the plurality of functional units, wherein the power converter comprises:
    an amplifier configured to convey an output current;
    a first loop comprising:
      a compensator configured to generate a first voltage based on the output current;
      first circuitry configured to:
        generate the output voltage based on the first voltage; and
        convey the output voltage to an input of the amplifier; and
    a second loop comprising:
      second circuitry configured to:
        generate a dynamically adapting feedback current based on the first voltage; and
        convey the dynamically adapting feedback current to the input of the amplifier.

16. The system on a chip as recited in claim 15, wherein the amplifier is an operational transconductance amplifier (OTA) and the compensator is a Type II compensator for the OTA.

17. The system on a chip as recited in claim 15, wherein the first circuitry comprises:
  a first current mirror configured to generate each of a first reference current and a target current based on the first reference current; and
  a plurality of step-down converters configured to:
    receive the target current; and
    generate the output voltage on an output node based at least in part on the target current.

18. The system on a chip as recited in claim 17, wherein the first circuitry further comprises a resistor connected to the output node and the input of the amplifier, wherein the dynamically adapting feedback current creates a voltage drop across the resistor between the input of the amplifier and the output voltage.

19. The system on a chip as recited in claim 15, wherein the second circuitry comprises:
  a second current mirror comprising:
    a diode-connected transistor configured to generate a second reference current;
    a plurality of current source transistors, each connected to a switch, wherein one or more of the plurality of current source transistors connected to closed switches generate the dynamically adapting feedback current based on the second reference current.

20. The system on a chip as recited in claim 19, wherein the second circuitry comprises a second converter comprising:
  a first order series resistor-capacitor (RC) filter configured to receive the first voltage, wherein the RC filter creates a response time of the second loop that is greater than a response time of the first loop; and
  a transistor with a drain terminal connected to the diode-connected transistor and a gate terminal connected to an output of the RC filter.

* * * * *